(12) United States Patent
Lim

(10) Patent No.: US 7,184,340 B2
(45) Date of Patent: Feb. 27, 2007

(54) CIRCUIT AND METHOD FOR TEST MODE ENTRY OF A SEMICONDUCTOR MEMORY DEVICE

(75) Inventor: Jong-Hyoung Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/256,357

(22) Filed: Oct. 21, 2005

(65) Prior Publication Data

US 2006/0092728 A1     May 4, 2006

(30) Foreign Application Priority Data

Nov. 1, 2004   (KR)   .................. 10-2004-0087768

(51) Int. Cl.
    *G11C 29/00* (2006.01)
(52) U.S. Cl. ...................... 365/201; 365/233
(58) Field of Classification Search ................ 365/201, 365/233
    See application file for complete search history.

(56) References Cited

U.S. PATENT DOCUMENTS 6,353,565 B2    3/2002   Ito
6,400,623 B2 *  6/2002   Ohno ................ 365/201
7,035,154 B2 *  4/2006   Takahashi et al. ......... 365/201

FOREIGN PATENT DOCUMENTS

| JP | 2000-215695 | 8/2000 |
| KR | 1020040003562 A | 1/2004 |

* cited by examiner

Primary Examiner—Vu A. Le
(74) Attorney, Agent, or Firm—F. Chau & Associates, LLC

(57) ABSTRACT

A circuit and method for test mode entry of a semiconductor memory device are provided. In a method of entering a semiconductor memory device into a test mode, an internal clock is generated in response to an external clock when a first condition is satisfied. An address combination signal is generated based on a first address combination and the internal clock. The semiconductor memory device is entered into the test mode using the internal clock and the address combination signal.

22 Claims, 9 Drawing Sheets

411

430

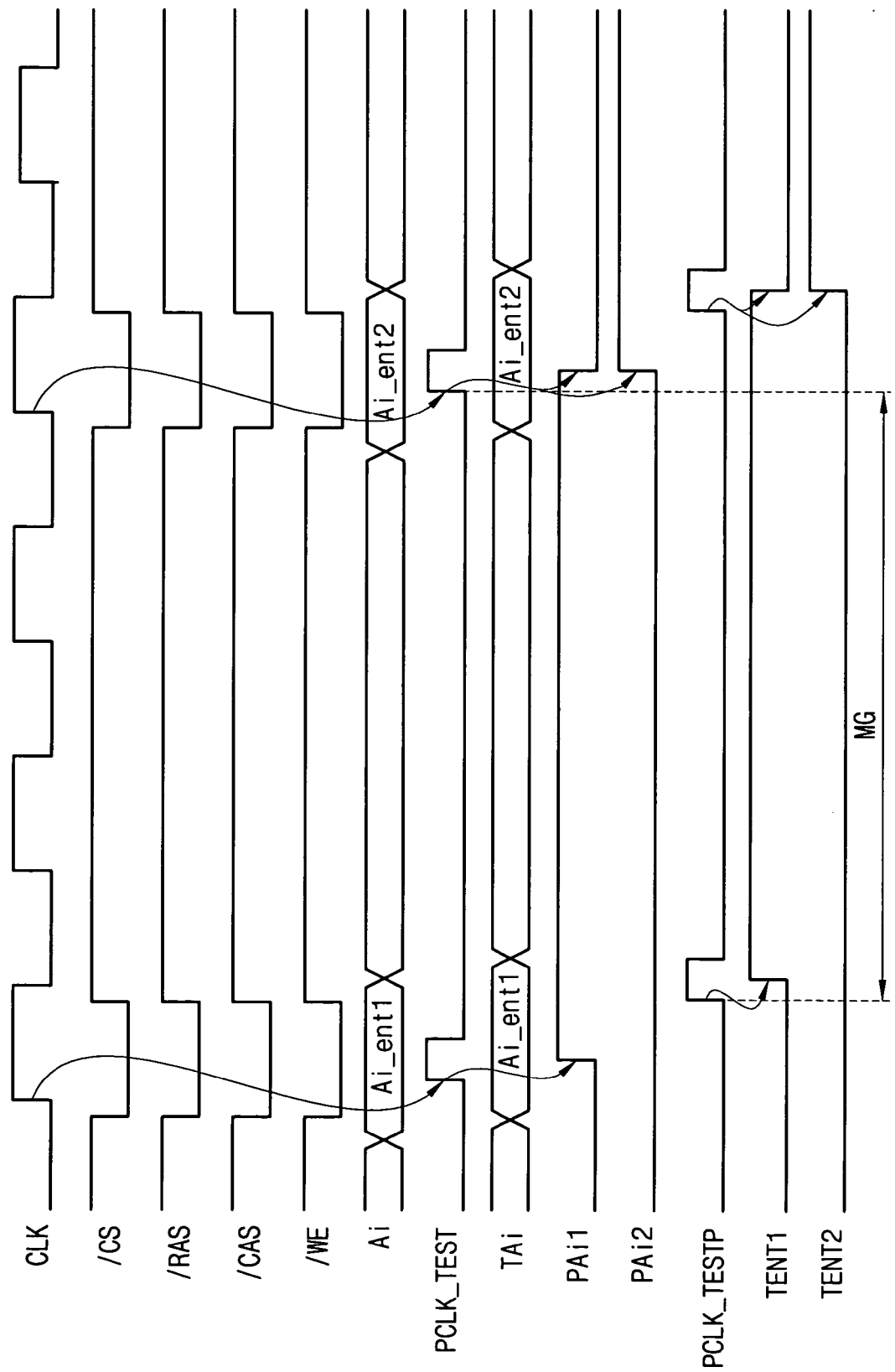

CIRCUIT AND METHOD FOR TEST MODE ENTRY OF A SEMICONDUCTOR MEMORY DEVICE

CROSS-REFERENCE TO RELATED APPLICATION

This application claims priority under 35 USC §119 to Korean Patent Application No. 2004-87768, filed on Nov. 1, 2004, the disclosure of which is incorporated by reference herein in its entirety for all purposes.

BACKGROUND OF THE INVENTION

1. Technical Field

The present invention relates to a semiconductor memory device, and more particularly to a circuit and method for controlling entry to a test mode of the semiconductor memory device.

2. Discussion of the Related Art

Generally, a semiconductor memory device includes a test mode so that test functions can be performed by the device manufacturer. To perform the test functions, such as those associated with the reliability of the semiconductor memory device, the device is placed in a test mode.

The test mode is an operating mode that is specifically used to test the semiconductor memory device. The functions of the test mode are not controlled by a user except for certain mode register set (MRS) commands for controlling device settings. For example, MRS commands such as column address strobe (CAS) latency or burst length may be controlled by the user.

A semiconductor memory device typically includes a test mode entry circuit for controlling entry to the test mode based on a particular address and/or command combination. A conventional test mode entry circuit will now be described with reference to FIGS. 1 and 2.

FIG. 1 is a block diagram illustrating a conventional test mode entry circuit.

Referring to FIG. 1, the test mode entry circuit includes an address buffer unit 110, a first address sampling unit 120, a second address sampling unit 130, a first flip-flop 140, a second flip-flop 150, a clock buffer unit 160 and a delay unit 170.

The address buffer unit 110 receives and buffers an address Ai and outputs a buffered address TAi.

The first address sampling unit 120 samples the buffered address TAi using a buffered clock PCLK to activate a first address combination signal PAi1 based on a predetermined address combination.

The second address sampling unit 130 samples the buffered address TAi using the buffered clock PCLK to activate a second address combination signal PAi2 based on a predetermined address combination. It is typically desirable to generate the first and second address combination signals PAi1 and PAi2 from different address combinations.

The first flip-flop 140 samples the first address combination signal PAi1 based on a delayed clock PCLKP to generate a first test mode entry signal TENT1.

The second flip-flop 150 samples the second address combination signal PAi2 based on the delayed clock PCLKP to generate a second test mode entry signal TENT2.

A test mode is entered in response to the first and second test mode entry signals TENT1 and TENT2. For example, when the first and second test mode entry signals TENT1 and TENT2 are successively activated, a semiconductor memory device including the test mode entry circuit enters the test mode.

As further shown in FIG. 1, the clock buffer unit 160 buffers an input clock CLK to generate the buffered clock PCLK.

The delay unit 170 receives and delays the buffered clock PCLK by a predetermined period of time to generate the delayed clock PCLKP. The first and second address combination signals PAi1 and PAi2 are sampled using the delayed clock PCLKP so that the first and second test mode entry signals TENT1 and TENT2 are stably generated.

Although not shown in FIG. 1, in addition to the two test mode entry signals TENT1 and TENT2, a command combination signal generated by a command combination it may also be used to perform the test mode entry.

FIG. 2 is a timing diagram illustrating an operation of the test mode entry circuit in FIG. 1.

Referring to FIG. 2, a first address combination Ai_ent1 and a second address combination Ai_ent2 are externally inputted, alternating once every two clock periods.

A buffered clock pulse PCLK is generated in every period of the externally provided input clock CLK.

The first address combination Ai_ent1 is sampled at a rising edge of a first buffered clock PCLK to activate a first address combination signal PAi1.

At a next rising edge of a second buffered clock PCLK, an address Ai does not correspond to either the first address combination Ai_ent1 or the second address combination Ai_ent2, so that neither the first address combination signal PAi1 nor the second address combination signal PAi2 is activated.

At a next rising edge of a third buffered clock PCLK, the second address combination Ai_ent2 is sampled to activate the second address combination signal PAi2.

At a next rising edge of a fourth buffered clock PCLK, the address Ai does not correspond to either the first address combination Ai_ent1 or the second address combination Ai_ent2, so that neither the first address combination signal PAi1 nor the second address combination signal PAi2 is activated.

The first and second address combination signals PAi1 and PAi2, each having an active state, are sampled using a clock PCLKP delayed from the buffered clock PCLK by a predetermined time period to generate the first and second test mode entry signals TENT1 and TENT2.

As shown in FIG. 2, the buffered clock PCLK has a rising edge in every period of the external clock CLK, and the first and second address combination signals PAi1 and PAi2 are sampled using the delayed clock PCLKP, delayed from the buffered clock PCLK, so that the first and second address combination signals PAi1 and PAi2 are sampled in every period of the external clock CLK.

Therefore, sampling of the address combination signals PAi1 and PAi2 should be completed before the address combination signals PAi1 and PAi2 are changed at a next rising edge of the buffered clock PCLK. This results in a decrease in a timing margin MG that corresponds to a time interval between a rising edge of the delayed clock PCLKP and a rising edge of the buffered clock PCLK.

When the timing margin MG between the rising edge of the delayed clock PCLKP and the rising edge of the buffered clock PCLK is decreased, certain functionalities of the test mode entry circuit may be affected. In addition, the timing margin MG is decreased as an operating frequency of a semiconductor memory device is increased. Thus, the timing margin MG is an important consideration when designing a semiconductor memory device including the test mode entry circuit.

For example, when the timing margin MG is decreased to zero, the address combination signals PAi1 and PAi2, which are to be sampled by the delayed clock PCLKP, may transition so that a hold time and a setup time for generating the test mode entry signals TENT1 and TENT2 may be difficult to secure. Therefore, a need exists for a circuit and a method that enable a semiconductor memory device having a high operating frequency to safely enter a test mode.

SUMMARY OF THE INVENTION

In an embodiment of the present invention, a method of entering a semiconductor memory device into a test mode is provided. An internal clock is generated in response to an external clock when a predetermined condition is satisfied. An address combination signal is generated based on a predetermined address combination and the internal clock. The test mode is entered using the internal clock and the address combination signal.

In another embodiment, the test mode is entered by generating a test mode entry signal by sampling the address combination signal based on the internal clock that is delayed by a predetermined time period.

For example, the predetermined condition may be such that a predetermined command combination is generated. The command combination is a combination of signals that are applied to an external command pin, e.g., a chip select signal /CS, a row address strobe signal /RAS, a column address strobe signal /CAS and a write enable signal /WE, etc.

In yet another embodiment, the internal clock generating unit activates the internal clock in response to the external clock when the predetermined command combination is generated, and deactivates the internal clock when the predetermined command combination is not generated.

In another embodiment, the predetermined command combination may not be available in a user mode. The predetermined condition may be such that a predetermined number of transitions of the external clock is reached. In still another embodiment, the internal clock is generated by dividing the external clock.

In yet another embodiment of the present invention, a test mode entry circuit of a semiconductor memory device is provided, which includes an internal clock generating unit, an address sampling unit and an entry control unit. The internal clock generating unit generates an internal clock signal in response to an external clock only when a predetermined condition is satisfied. The address sampling unit generates an address combination signal based on a predetermined address combination and the internal clock signal. The entry control unit performs a test mode entry based on the internal clock signal and the predetermined address combination.

For example, the predetermined condition is such that a predetermined command combination is generated.

In another embodiment, the internal clock generating unit transitions the internal clock signal in response to the external clock and maintains the internal clock signal when the predetermined command combination is not generated.

In yet another embodiment, the entry control unit performs the test mode entry operation by generating a test mode entry signal by sampling the address combination signal based on the internal clock signal that is delayed by a predetermined time period.

For example, the test mode entry signal includes at least two test mode entry signals generated based on at least two address combinations. The predetermined condition may be such that a predetermined number of transitions of the external clock is reached. In still another embodiment, the internal clock is generated by dividing the external clock with a predetermined divide ratio.

In another embodiment of the present invention, a test mode entry circuit of a semiconductor memory device is provided. The test mode entry circuit includes: an internal clock generator that generates an internal clock signal according to a transition of a buffered clock in response to a first command combination; a first address sampling unit that samples a buffered address based on the internal clock to activate a first address combination signal based on a first address combination; a second address sampling unit that samples the buffered address based on the internal clock signal to activate a second address combination signal based on a second address combination; and a test mode entry controller that generates a first test mode entry signal based on the first address combination signal and a delayed internal clock signal and a second test mode entry signal based on the second address combination signal and the delayed internal clock signal.

The internal clock generator includes: a command buffer that receives an external command signal, buffers the external command signal and outputs the buffered external command signal as the first command combination; and a clock generator that generates the internal clock signal according to the transition of the buffered clock in response to the first command combination. The internal clock generator may be a clock divider.

The test mode entry controller includes: a first flip flop that samples the first address combination signal to generate the first test mode entry signal based on the delayed internal clock signal; a second flip flop that samples the second address combination signal to generate the second test mode entry signal based on the delayed internal clock signal; and a delay unit that generates the delayed internal clock signal based on the internal clock signal.

BRIEF DESCRIPTION OF THE DRAWINGS

The present invention will become more apparent to those of ordinary skill in the art by describing, in detail, exemplary embodiments thereof with reference to the attached drawings, wherein like elements are represented by like reference numerals, which are given by way of illustration and thus do not limit the exemplary embodiments of the present invention.

FIG. 7A is a timing diagram illustrating an operation of a test mode entry circuit according to an exemplary embodiment of the present invention using the internal clock generating unit in FIG. 6A.

DESCRIPTION OF EXEMPLARY EMBODIMENTS

It will be understood that, although the terms "first", "second", etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "comprises", "comprising, ", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 3:
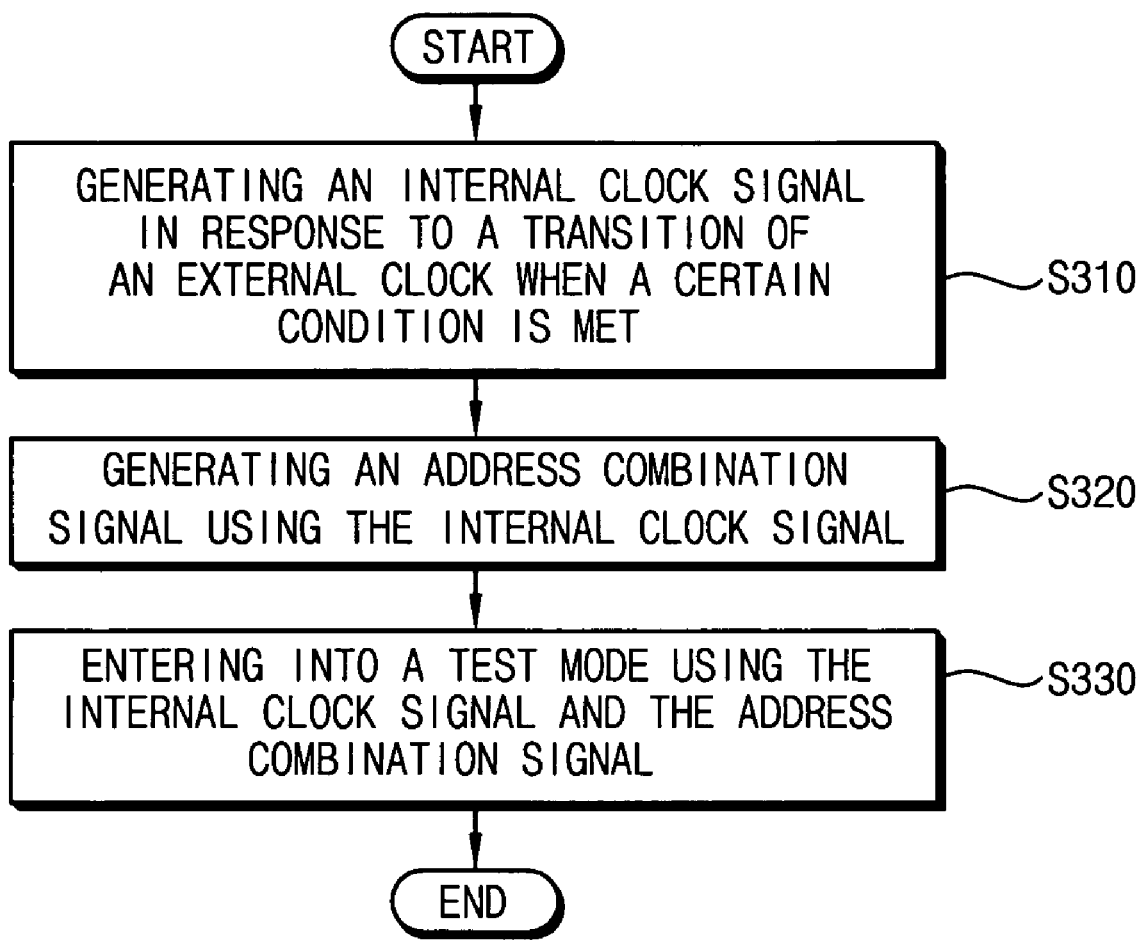
FIG. 3 is a flowchart illustrating a method for entering a test mode of a semiconductor memory device according to an exemplary embodiment of the present invention.

FIG. 3 is a flowchart illustrating a method for entering a test mode of a semiconductor memory device according to an exemplary embodiment of the present invention.

Referring to FIG. 3, an internal clock signal is generated in response to a transition of an external clock when a condition is met (step S310).

In one embodiment, the condition may relate to a generation of a command combination. The command combination may be a combination of signals that are applied to an external command pin, e.g., a chip select signal /CS, a row address strobe signal /RAS, a column address strobe signal /CAS and a write enable signal /WE, etc. The command pin may be, for example, that of a semiconductor memory device or a test mode entry circuit according to an exemplary embodiment of the present invention.

When a predetermined command combination is generated, an internal clock signal may be generated based on the external clock. When the predetermined command combination is not generated, the internal clock signal may not be changed despite the transition of the external clock.

In another exemplary embodiment, the predetermined command combination may not be available in a user mode. In addition, the external clock may be buffered and the buffered external clock may be used for generating the internal clock signal. Further, the condition for generating the internal clock signal may relate to a number of transitions of the external clock. For example, the internal clock may be generated by dividing the external clock.

Next, an address combination signal is generated by a predetermined address combination using the internal clock signal (step S320).

The predetermined address combination may be a combination of address signals that is predefined by a circuit for use with the method.

For example, a first inputted address may be sampled by using the internal clock signal and then it may be determined whether the sampled address corresponds to the predetermined address combination to generate the address combination signal. The address combination signal is activated when the sampled address corresponds to the predetermined combination.

Next, the test mode entry is performed using the internal clock signal and the address combination signal (step S330).

The test mode entry may be performed by using the sampled address combination signal based on the internal clock signal that is delayed by a predetermined time period.

For example, when the sampled address combination signal is activated based on the internal clock signal that is delayed by a predetermined time period, the semiconductor memory device may enter the test mode.

In addition, when at least two address combination signals are generated, the semiconductor memory device may enter the test mode when sampled address combination signals are sequentially activated by the internal clock signal that is delayed by a predetermined time period.

The semiconductor memory device may also enter the test mode when a predetermined command combination is generated simultaneously with the activation of the sampled address combination signals.

Thus, the address combination signal is generated using the internal clock signal that is generated in response to a transition of the external clock only when a certain condition is met so that a frequency of the address combination signal is decreased to secure a timing margin of a test mode entry circuit according to an exemplary embodiment of the present invention.

Figure 4A:
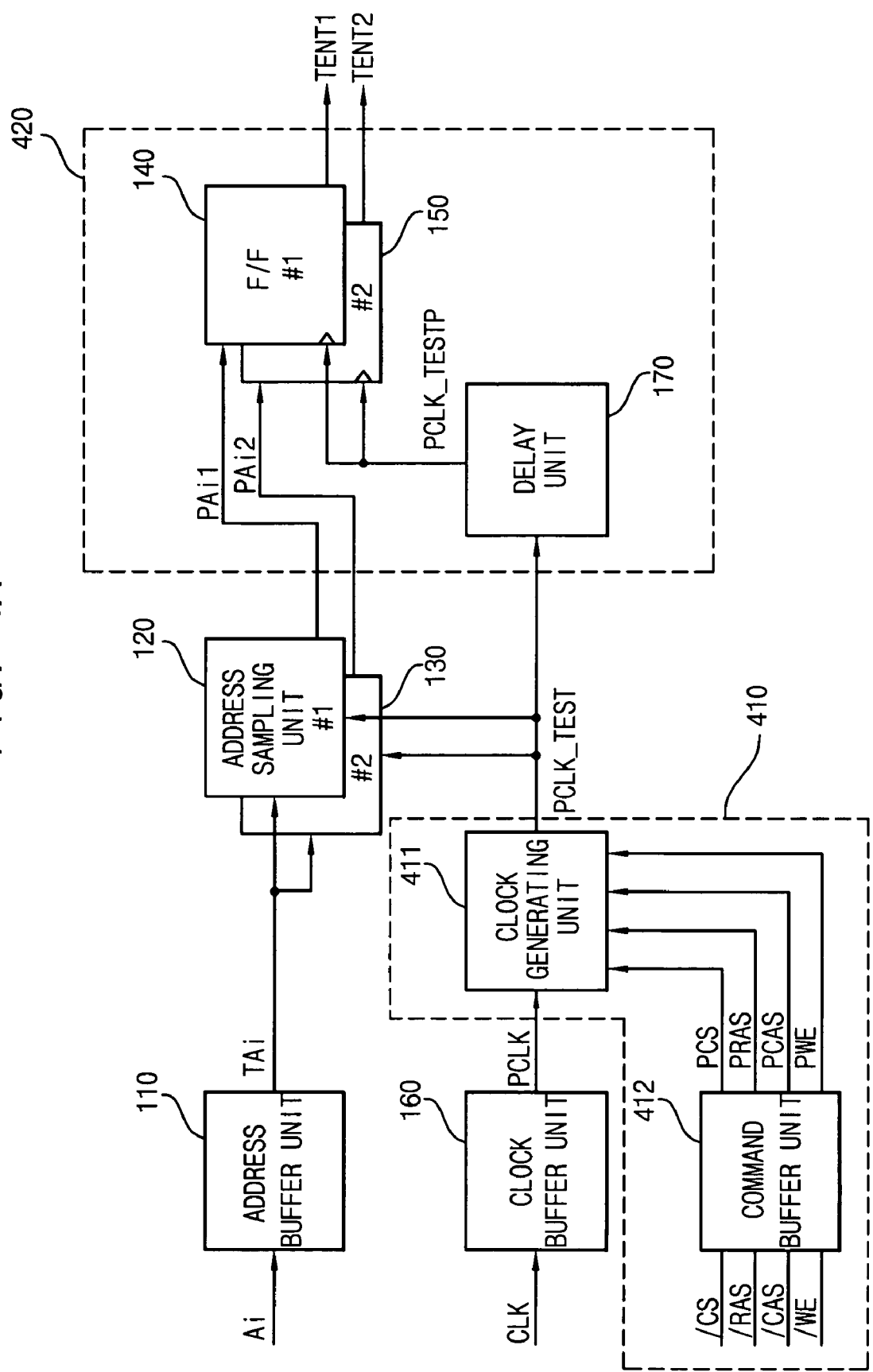
FIG. 4A is a block diagram illustrating a test mode entry circuit according to an exemplary embodiment of the present invention.

FIG. 4A is a block diagram illustrating a test mode entry circuit according to an exemplary embodiment of the present invention.

Referring to FIG. 4A, the test mode entry circuit includes an address buffer unit 110, a first address sampling unit 120, a second address sampling unit 130, a clock buffer unit 160, an internal clock generating unit 410 and an entry control unit 420.

Figure 1:
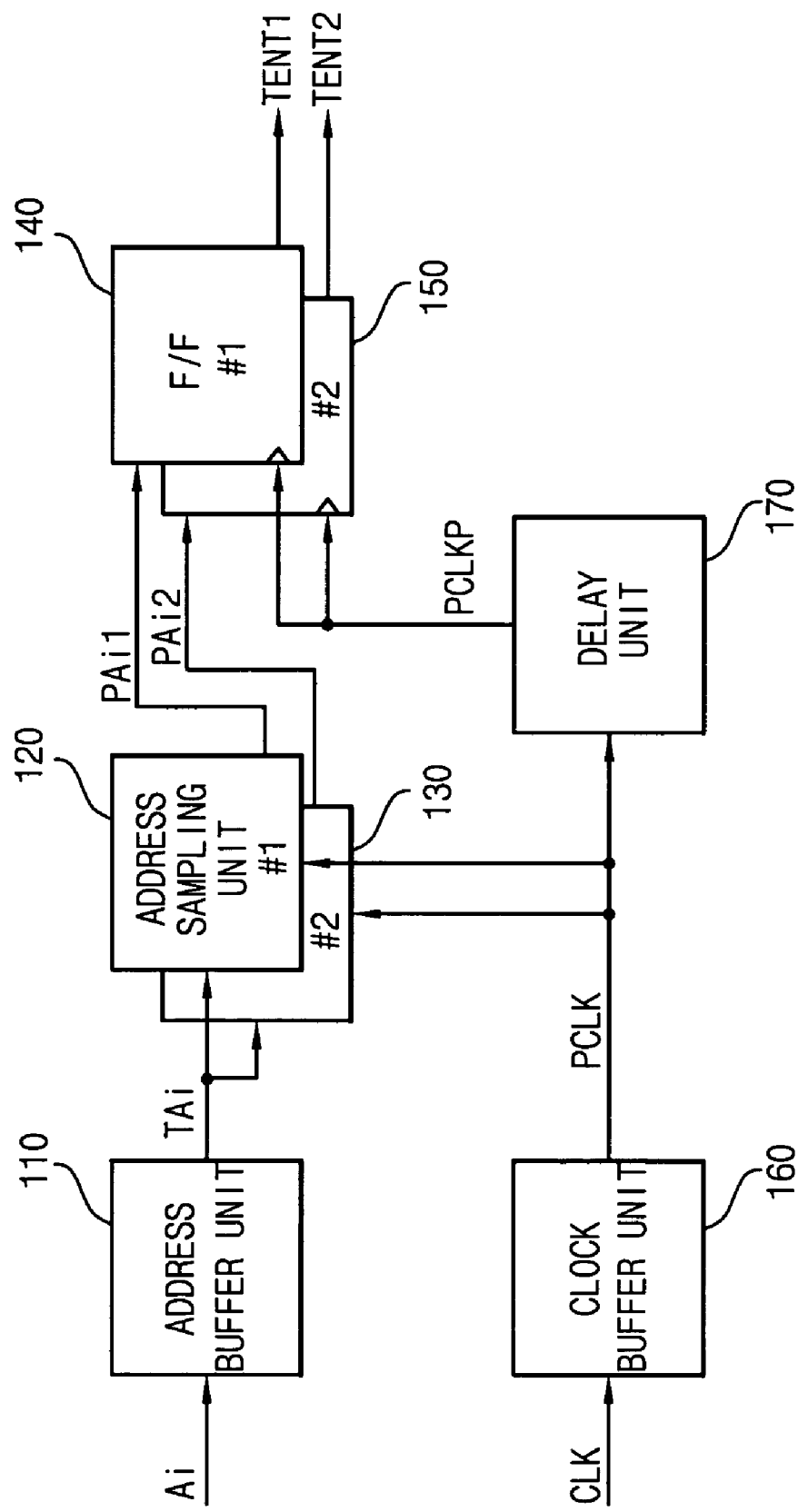
FIG. 1 is a block diagram illustrating a conventional test mode entry circuit.
Figure 2:
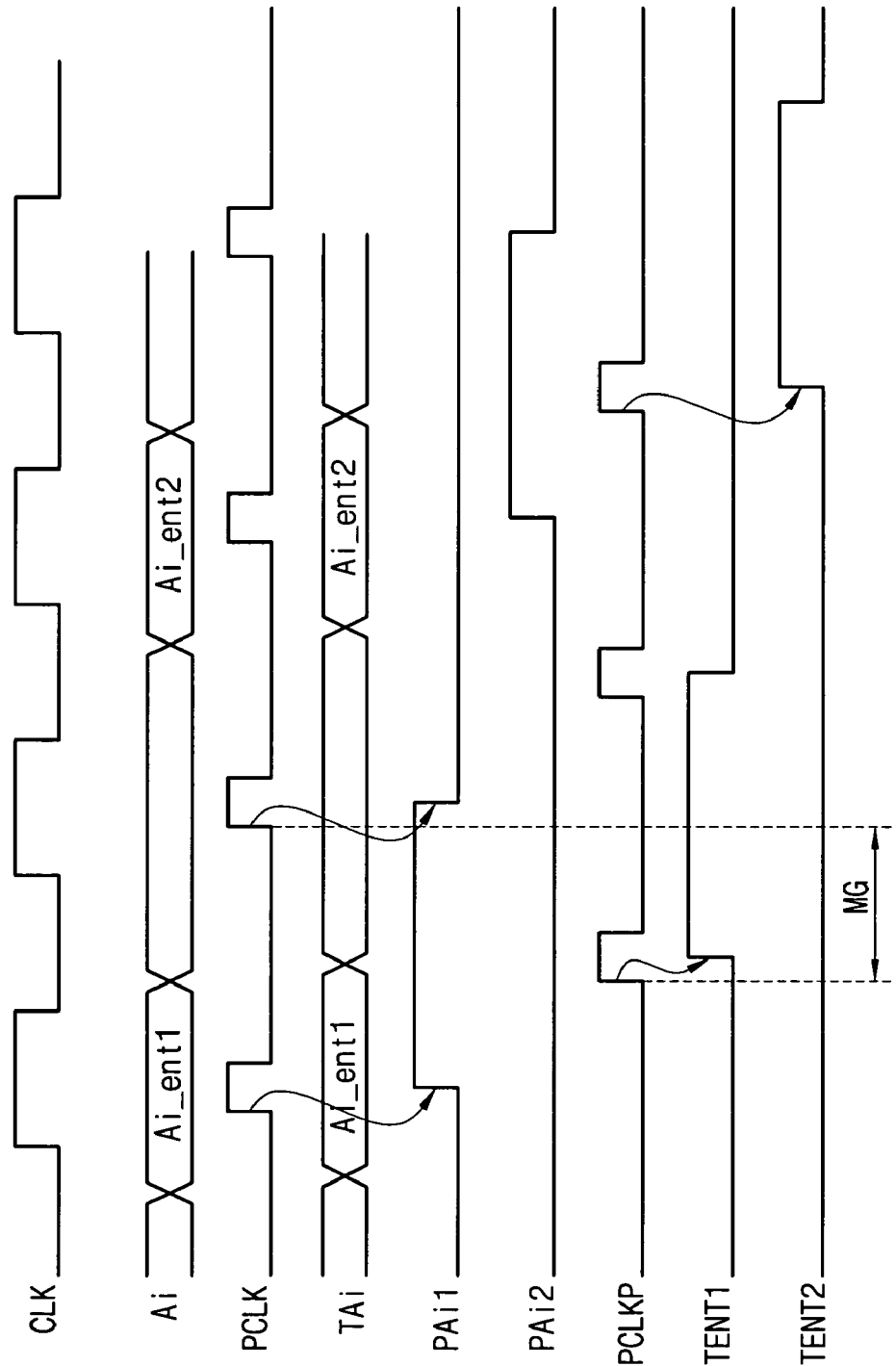
FIG. 2 is a timing diagram illustrating an operation of the test mode entry circuit in FIG. 1.

The internal clock generating unit 410 may include a clock generating unit 411 and a command buffer unit 412. The entry control unit 420 may include a first flip-flop 140, a second flip-flop 150 and a delay unit 170. The address buffer unit 110, the first and second address sampling units 120 and 130, the first and second flip-flops 140 and 150, the clock buffer unit 160 and the delay unit 170 in FIG. 4A are similar in form and function to analogous elements in FIG. 1.

As shown in FIG. 4A, the address buffer 110 buffers an input address Ai to output a buffered address TAi.

The first address sampling unit 120 samples the buffered address TAi based on an internal clock signal PCLK_TEST to activate a first address combination signal PAi1 based on a predetermined address combination. The predetermined address combination may be a combination of address signals that is predefined by a circuit coupled to the test mode entry circuit.

The second address sampling unit 130 samples the buffered address TAi based on the internal clock signal PCLK_TEST to activate a second address combination signal PAi2 based on a predetermined address combination. It is desirable that the second address combination signal PAi2 is generated from an address combination that is different than the address combination generating the first address combination signal PAi1.

The clock buffer unit 160 buffers an externally applied input clock CLK to generate a buffered clock PCLK.

In one embodiment, the address buffer unit 110 and the clock buffer unit 160 may not be included in the test mode entry circuit. When the address buffer unit 110 and the clock buffer unit 160 are not included in the test mode entry circuit, the address sampling units 120, 130 and the internal clock generating unit 410 are used to perform buffering operations.

Referring again to FIG. 4A, the internal clock generating unit 410 receives the buffered clock PCLK and generates the internal clock signal PCLK_TEST according to a transition of the buffered clock PCLK under a condition. Particularly, the internal clock generating unit 410 generates the internal clock signal PCLK_TEST according to the transition of the buffered clock PCLK when a predetermined command combination is generated.

The command combination may be a combination of signals that are applied to an external command pin, e.g., a chip select signal /CS, a row address strobe signal /RAS, a column address strobe signal /CAS and a write enable signal /WE, etc. The command pin may be, for example, that of a semiconductor memory device or the test mode entry circuit.

Thus, when a predetermined command combination is generated, an internal clock signal PCLK_TEST may be generated based on the external clock CLK, and when the predetermined command combination is not generated, the internal clock signal PCLK_TEST may not be changed despite the transition of the external clock CLK. Therefore, the sampling of unnecessary address combination signals may be avoided. In one embodiment, the predetermined command combination may not be available in a user mode.

As shown in FIG. 4A, the command buffer unit 412 receives the chip select signal /CS, the row address strobe signal /RAS, the column address strobe signal /CAS and the write enable signal /WE, and buffers the signals to become output buffered command signals PCS, PRAS, PCAS and PWE. During the buffering, a logic level of an input signal may be inverted so that a buffered output signal has an inverted logic level.

In one embodiment, the command buffer 412 may not be included in the test mode entry circuit. For example, the command buffer 412 may instead be included in the clock generating unit 411. Alternatively, the command buffer 412 may be implemented by the address buffer unit 110 and the clock buffer unit 160.

As further shown in FIG. 4A, the clock generating unit 411 receives the buffered clock PCLK and buffered signals PCS, PRAS, PCAS and PWE outputted from the command buffer unit 412 to generate the internal clock signal PCLK_TEST according to the transition of the external clock CLK in response to a predetermined command combination. The clock generating unit 411 may receive the command signals PCS, PRAS, PCAS and PWE directly from an external command pin instead of receiving the buffered command signals PCS, PRAS, PCAS and PWE from the command buffer unit 412.

The entry control unit 420 performs the test mode entry by using the internal clock signal PCLK_TEST and address combination signals PAi1 and PAi2. The operations of elements of the entry control unit 420 will now be described.

A first flip-flop 140 of the entry control unit 420 samples the first address combination signal PAi1 to generate a first test mode entry signal TENT1 based on a delayed internal clock signal PCLK_TESTP.

A second flip-flop 150 of the entry control unit 420 samples the second address combination signal PAi2 to generate a second test mode entry signal TENT2 based on the delayed internal clock signal PCLK_TESTP.

Using the first and second test mode entry signals TENT1 and TENT2, the test mode entry is performed. For example, when the first and second test mode entry signals TEST1 and TENT2 are sequentially activated, a semiconductor memory device including the test mode entry circuit of FIG. 4A is controlled to enter the test mode. A command combination signal generated by a predetermined command combination may also be used in addition to the first and second test mode entry signals TENT1 and TENT2 to control the semiconductor memory device to enter the test mode.

The delay unit 170 receives the internal clock signal PCLK_TEST and delays the internal clock signal PCLK_TEST by a predetermined time period to generate the delayed internal clock signal PCLK_TESTP. Based on the delayed internal clock signal PCLK_TESTP, the first and second address combination signals PAi1 and PAi2 are sampled to stably generate the first and second test mode entry signals TENT1 and TENT2.

In the test mode entry circuit in FIG. 4A, the two address combination signals PAi1 and PAi2 are generated by the two address sampling units 120 and 130 based on two input address combinations. The delayed address combination signals are sampled by the delayed internal clock signal PCLK_TESTP to generate the two test mode entry signals TENT1 and TENT2. The two test mode entry signals TENT1 and TENT2 are used so that the test mode may not be entered due to an address combination inadvertently entered by a user. Thus, when a semiconductor memory device is designed to enter into the test mode only in response to the successive generation of the two test mode entry signals TENT1 and TENT2 in accordance with an exemplary embodiment of the present invention, an inadvertent test mode entry may be prevented.

The entry control unit 420 may be implemented in a variety of alternative embodiments. For example, the entry control unit 420 may generate only one test mode entry signal or more than three test mode entry signals. In addition, a semiconductor memory device including the test mode entry circuit of FIG. 4A may be designed to enter the test mode when a command combination signal generated by a command combination is activated and the two test mode entry signals TENT1 and TENT2 are sequentially generated.

Figure 4B:
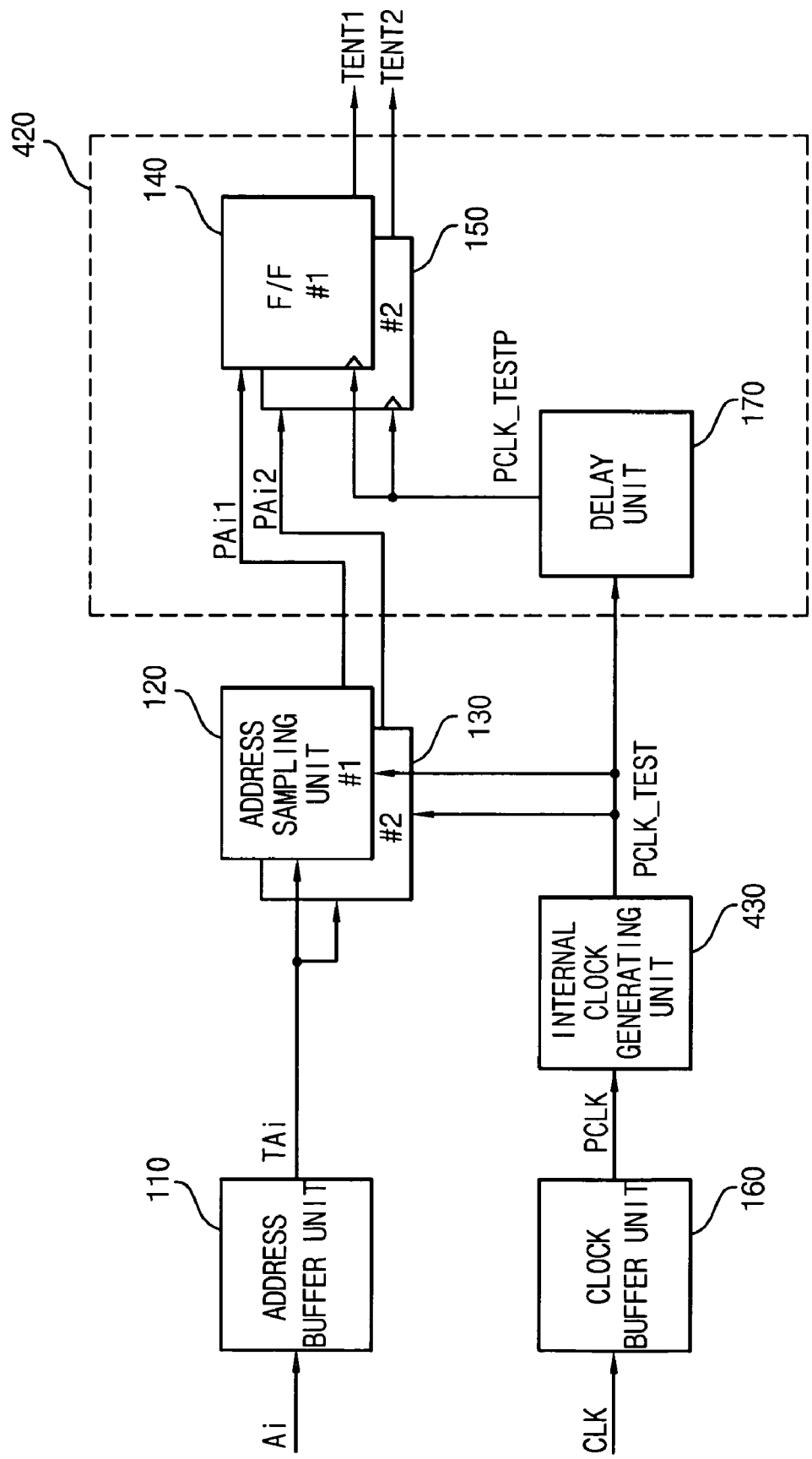
FIG. 4B is a block diagram illustrating a test mode entry circuit according to another exemplary embodiment of the present invention.

FIG. 4B is a block diagram illustrating a test mode entry circuit according to another exemplary embodiment of the present invention.

Referring to FIG. 4B, the test mode entry circuit includes an address buffer unit 110, a first address sampling unit 120, a second address sampling unit 130, a clock buffer unit 160, an internal clock generating unit 430 and an entry control unit 420.

The entry control unit 420 may include a first flip-flop 140, a second flip-flop 150 and a delay unit 170. The address buffer unit 110, the first and second address sampling units 120 and 130, the clock buffer unit 160 and the entry control unit 420 are similar to those described in FIG. 4A. In addition, the address buffer unit 110, the first and second address sampling units 120 and 130, the first and second flip-flops 140 and 150, the clock buffer unit 160 and the delay unit 170 in FIG. 4B are similar in form and function to analogous elements in FIG. 1.

As shown in FIG. 4B, the internal clock generating unit 430 receives the buffered clock PCLK and generates the internal clock signal PCLK_TEST according to a transition of the buffered clock PCLK under a condition. Particularly, the internal clock generating unit 430 generates the internal clock signal PCLK_TEST in response to an active state of the buffered clock PCLK when transitions (e.g., state changes) of the external clock CLK are generated a predetermined number of times.

The internal clock signal PCLK_TEST may then be generated by dividing the external clock CLK. Therefore, the sampling of unnecessary address combination signals may be avoided in accordance with a divide ratio of the external clock CLK. In this case, a test mode entry command should have a frequency lower than a frequency of the internal clock signal PCLK_TEST.

Figure 5A:
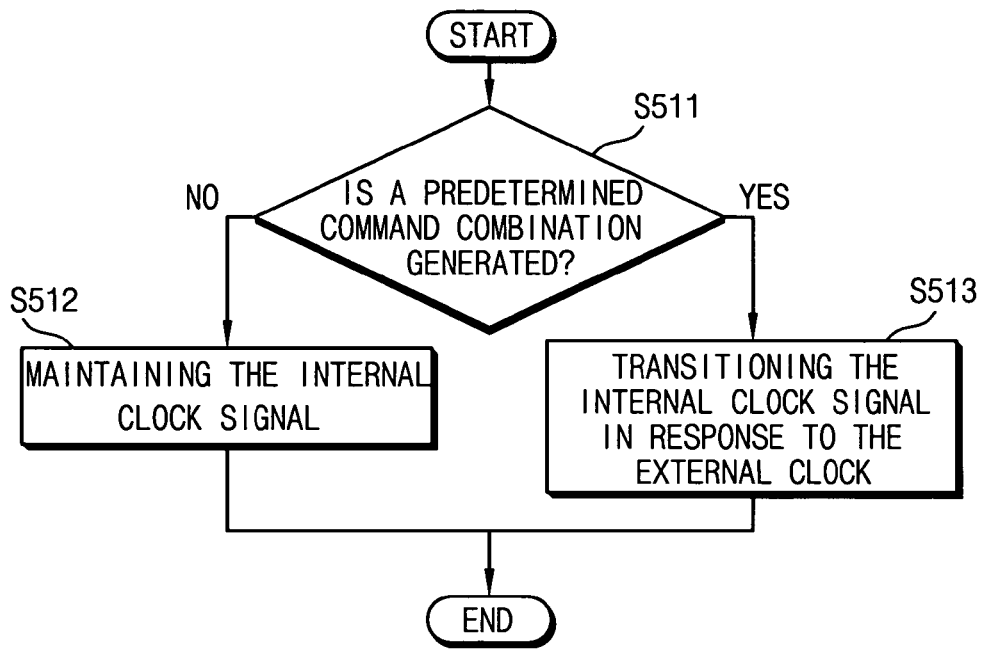
FIG. 5A is a flowchart illustrating an exemplary operation performed at step S310 in FIG. 3.

FIG. 5A. is a flowchart illustrating an exemplary operation performed at step S310 in FIG. 3.

Referring to FIG. 5A, it is determined whether a predetermined command combination is generated (step S511).

The command combination is a combination of signals that are applied to an external command pin, e.g., a chip select signal /CS, a row address strobe signal /RAS, a column address strobe signal /CAS and a write enable signal /WE, etc. The command pin may be, for example, that of a semiconductor memory device or a test mode entry circuit according to an exemplary embodiment of the present invention.

The predetermined command combination may not be available in a user mode.

If it is determined that the predetermined command combination is not generated in step S511, the internal clock signal PCLK_TEST may not be changed (step S512).

If it is determined that the predetermined command combination is generated in step S511, the internal clock signal PCLK_TEST may be changed according to a transition of the external clock CLK (step S513).

Therefore, the sampling of unnecessary address combination signals may be avoided so that a timing margin is secured.

Figure 5B:
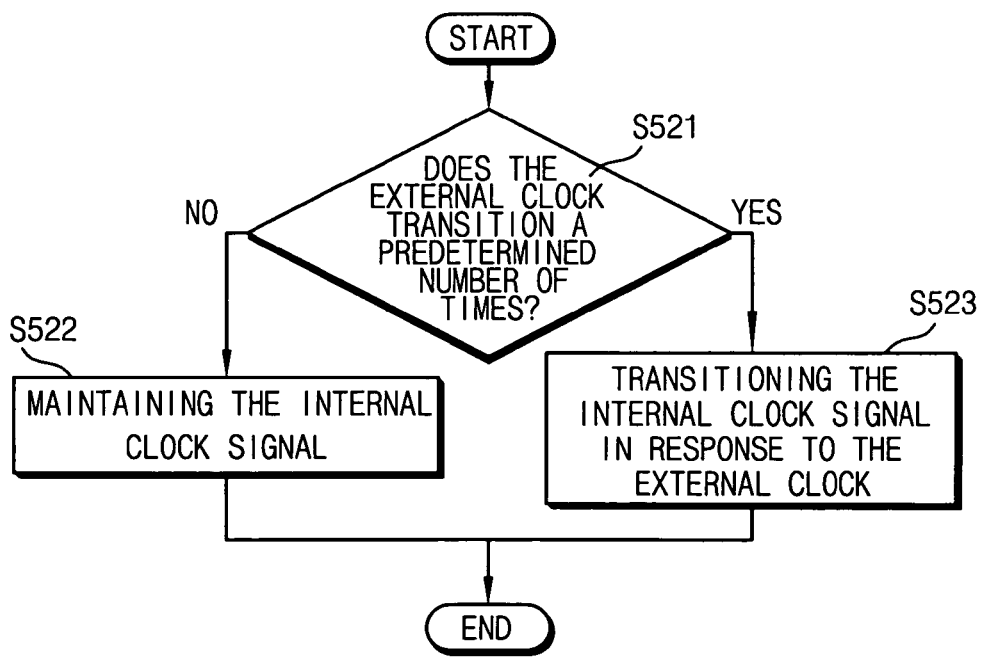
FIG. 5B is a flowchart illustrating another exemplary operation performed at step S310 in FIG. 3.

FIG. 5B is a flowchart illustrating another exemplary operation performed at step S310 in FIG. 3.

Referring to FIG. 5B, it is determined whether the external clock CLK transitions a predetermined number of times (step S521).

For example, it may be determined whether a number of rising edge transitions of the external clock CLK reaches a predetermined number. The predetermined number may be a natural number or a power of 2. Alternatively, it may be determined whether a number of the rising edge transitions and falling edge transitions of the external clock CLK reaches the predetermined number.

If it is determined that the transitions (e.g., state changes) of the external clock CLK are not generated the predetermined number of times in step S521, the internal clock signal PCLK_TEST may not be changed (step S522).

If it is determined that the transitions of the external clock CLK are generated the predetermined number of times in step S521, the internal clock signal PCLK_TEST may be changed according to the transition of the external clock CLK (step S523).

Therefore, the sampling of unnecessary address combination signals may be avoided so that a timing margin may be secured.

Figure 6A:
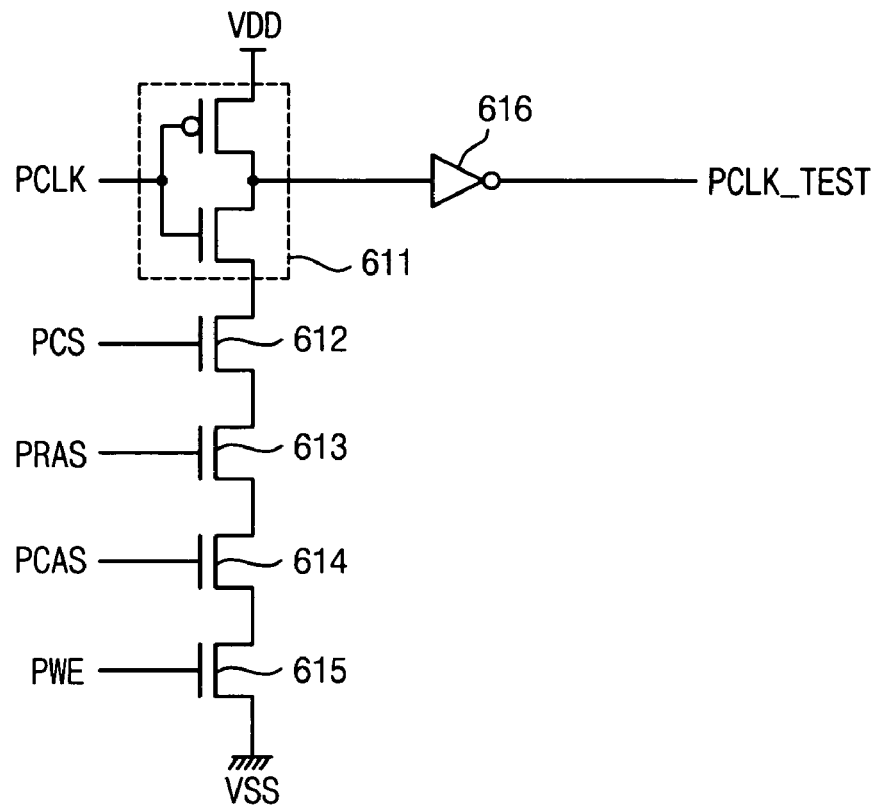
FIG. 6A is a circuit diagram illustrating an internal clock generating unit in FIG. 4A according to an exemplary embodiment of the present invention.

FIG. 6A is a circuit diagram illustrating the internal clock generating unit 411 in FIG. 4A according to an exemplary embodiment of the present invention.

Referring to FIG. 6A, the internal clock generating unit 411 includes a first inverter 611, four CMOS transistors 612, 613, 614 and 615 and a second inverter 616.

The first inverter 611 receives and inverts the buffered clock PLCK. Although the buffered clock PCLK is applied to the internal clock generating unit 411 as shown in FIG. 6A, the external clock CLK may instead be applied to the internal clock generating unit 411.

The four CMOS transistors 612, 613, 614 and 615 are serially coupled between the first inverter 611 and a power supply voltage VSS. The buffered command signals PCS, PRAS, PCAS and PWE are respectively applied to gates of the CMOS transistors 612, 613, 614 and 615. The buffered chip select signal PCS, the buffered row address strobe signal PRAS, the buffered column address strobe signal PCAS and the buffered write enable signal PWE may be inverted signals of those applied to respective command pins of a test mode entry circuit according to an exemplary embodiment of the present invention.

The first inverter 611 functions only when all the signals applied to the respective gates of the CMOS transistors 612, 613, 614 and 615 are logic "1".

An output of the first inverter 611 is again inverted by the second inverter 616. Therefore, when all the signals applied to the respective gates of the CMOS transistors 612, 613, 614 and 615 are logic "1", the buffered clock PCLK is generated as the internal clock signal PCLK_TEST.

When any one of the signals applied to the respective gates of the CMOS transistors 612, 613, 614 and 615 is logic "0", the first inverter 611 floats so that the inverting may not be performed. Thus, when any one of the signals applied to the respective gates of the CMOS transistors 612, 613, 614 and 615 is logic "0", the change in the buffered clock PCLK is not transmitted to the internal clock signal PCLK_TEST so that the internal clock signal PCLK_TEST does not change.

As a result, only when the command combination is such that all the signals applied to the respective gates of the CMOS transistors 612, 613, 614 and 615 are logic "1", the internal clock signal PCLK_TEST is generated in response to the external clock CLK. Otherwise, the internal clock signal PCLK_TEST remains constant independent of the transition of the external clock CLK.

Figure 6B:
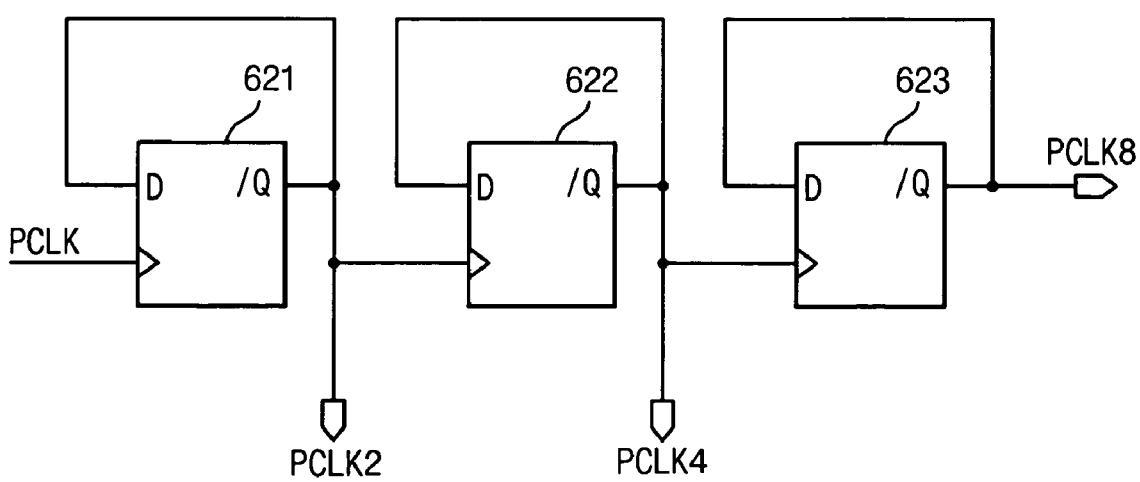
FIG. 6B is a circuit diagram illustrating an internal clock generating unit in FIG. 4B according to an exemplary embodiment of the present invention.

FIG. 6B is a circuit diagram illustrating the internal clock generating unit 430 in FIG. 4B according to an exemplary embodiment of the present invention.

Referring to FIG. 6B, the internal clock generating unit 430 is implemented in a clock divider using a D flip-flop. The clock divider in FIG. 6B is well-known to those of ordinary skill in the art.

The clock divider in FIG. 6B may divide the buffered clock PCLK into a clock PCLK2 having twice a clock period of the buffered clock PCLK, a clock PCLK4 having four times a clock period of the buffered clock PCLK and a clock PCLK8 having eight times a clock period of the buffered clock PCLK.

An output of a first flip-flop 621 is toggled at a rising edge of the buffered clock PCLK to output the clock PCLK2. An output of a second flip-flop 622 is toggled at a rising edge of the clock PCLK2 to output the clock PCLK4. An output of a third flip-flop 623 is toggled at a rising edge of the clock PCLK4 to output the clock PCLK8. Therefore, the divided clock PCLK2, the divided clock PCLK4 and the divided clock PCLK8 may be outputted as the internal clock signal PCLK_TEST.

FIG. 7A is a timing diagram illustrating an operation of a test mode entry circuit according to an exemplary embodiment of the present invention using the internal clock generating unit 411 in FIG. 6A.

Referring to FIG. 7A, the first address combination Ai_ent1 and the second address combination Ai_ent2 are inputted every three clock periods of the external clock CLK.

As can be seen from FIG. 7A, the internal clock signal PCLK_TEST is changed in response to a rising transition of the external clock CLK under a condition with a predetermined command combination, and the address combination signals PAi1 and PAi2 are sampled using the delayed internal clock signal PCLK_TESTP that is delayed from the internal clock signal PCLK_TEST.

In one embodiment, the predetermined command combination is such that the chip select signal /CS, the row address strobe signal /RAS, the column address strobe signal /CAS and the write enable signal /WE all are logic "0". In other words, the four CMOS transistors 612, 613, 614 and 615 in FIG. 6A are turned on.

Referring again to FIG. 7A, a rising edge of the internal clock signal PCLK_TEST is not present in every clock period of the external clock CLK but is instead generated in response to a transition of the external clock CLK with a predetermined command combination.

When the command combination is such that the chip select signal /CS, the row address strobe signal /RAS, the column address strobe signal /CAS and the write enable signal /WE are all logic "0", the first address combination Ai_ent1 is sampled at a rising edge of the internal clock signal PCLK_TEST to activate the first address combination signal PAi1.

Still referring to FIG. 7A, during the next two clock periods of the external clock CLK, the command combination is such that the chip select signal /CS, the row address strobe signal /RAS, the column address strobe signal /CAS and the write enable signal /WE are not logic "0" so that the internal clock signal PCLK_TEST does not rise in response to the external clock CLK. Therefore, the address combination Ai is not sampled.

When the external clock CLK rises with the chip select signal /CS, and the row address strobe signal /RAS, the column address strobe signal /CAS and the write enable signal /WE are logic "0", a rising edge of the internal clock signal PCLK_TEST is generated. The first address combination signal PAi1 is then inactivated and the second address combination is sampled to activate the second address combination signal PAi2.

Based on the delayed internal clock signal PCLK_TESTP that is delayed from the internal clock signal PCLK_TEST, the activated first address combination signal PAi1 and the second address combination signal PAi2 are respectively sampled to generate the first and second test mode entry signals TENT1 and TENT2.

As further shown in FIG. 7A, a rising edge of the internal clock signal PCLK_TEST is not generated in every clock period of the external clock CLK, instead the rising edge is generated by a predetermined command combination. Therefore, the address combination signals PAi1 and PAi2 are sampled using the internal clock signal PCLK_TESTP delayed from the internal clock signal PCLK_TEST so that a timing margin MG of a test mode entry circuit according to an exemplary embodiment of the present invention is increased as compared to sampling the address combination signals every clock period of the external clock CLK.

Therefore, a hold time and a setup time for generating the test mode entry signals TENT1 and TENT2 may be sufficiently assured.

Figure 7B:
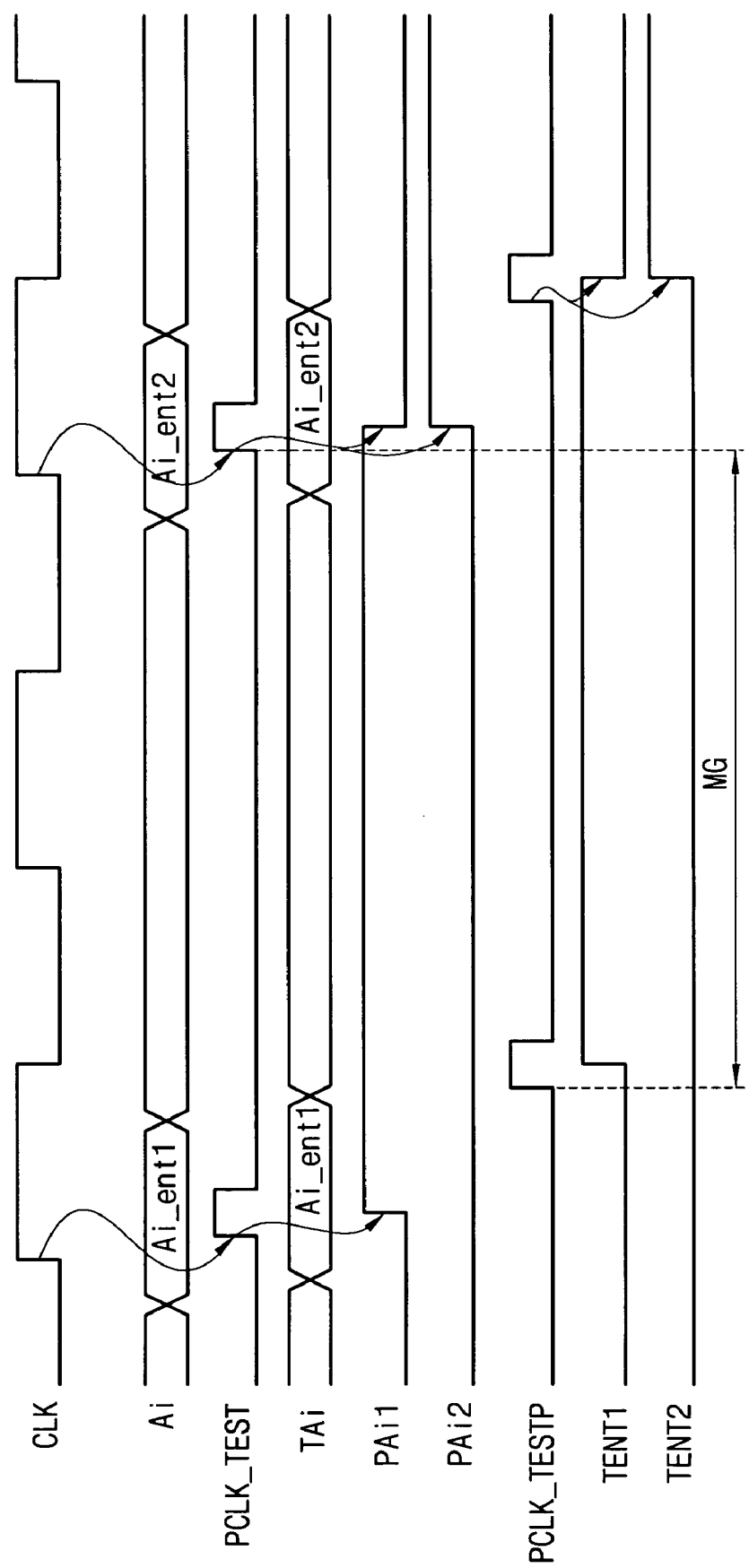
FIG. 7B is a timing diagram illustrating an operation of a test mode entry circuit according to an exemplary embodiment of the present invention using the internal clock generating unit in FIG. 6B.

FIG. 7B is a timing diagram illustrating an operation of a test mode entry circuit according to an exemplary embodiment of the present invention using the internal clock generating unit 430 in FIG. 6B.

In FIG. 7B, the first address combination Ai_ent1 and the second address combination Ai_ent2 are inputted every two clock periods of the external clock CLK. In FIG. 7B, the clock PCLK2 in FIG. 6B having twice the clock period of the buffered clock PCLK is outputted as the internal clock signal PCLK_TEST. In other words, the clock PCLK2 in FIG. 6B is buffered and outputted as the internal clock signal PCLK_TEST.

Referring to FIG. 7B, the address combination signals PAi1 and PAi2 are sampled using the delayed internal clock signal PCLK_TESTP that is delayed from the internal clock signal PCLK_TEST after a predetermined number of transitions of the external clock CLK.

Referring again to FIG. 7B, the internal clock signal PCLK_TEST does not have a rising transition in every period of the external clock CLK but has a rising transition in every second rising edge of the external clock CLK.

Thus, the first address combination Ai_ent1 is sampled at a rising edge of the internal clock signal PCLK_TEST to activate the first address combination signal PAi1.

The first address combination Ai_ent1 is not sampled at a next rising edge of the external clock CLK. A rising edge of the internal clock signal PCLK_TEST is generated at a second rising edge of the external clock CLK. The first address combination signal PAi1 is inactivated and the second address combination Ai_ent2 is sampled to activate the second address combination signal PAi2.

Using the internal clock signal PCLK_TESTP delayed from the internal clock signal PCLK_TEST by a predetermined time period, the activated first and second address combination signals PAi1 and PAi2 are sampled to generate the first and second test mode entry signals TENT1 and TENT2, respectively.

Still referring to FIG. 7B, a rising edge of the internal clock signal PCLK_TEST does not occur in every clock period of the external clock CLK, instead the rising edge occurs every second rising edge transition of the external clock CLK. The address combination signals PAi1 and PAi2 are sampled using the internal clock signal PCLK_TESTP delayed from the internal clock signal PCLK_TEST so that a timing margin MG of a test mode entry circuit according to an exemplary embodiment of the present invention is increased as compared to sampling the address combination signals every clock period of the external clock CLK.

Therefore, a sufficient hold time and a setup time for generating the test mode entry signals TENT1 and TENT2 is assured.

The above exemplary embodiments of the present invention are mainly discussed with regard to generating the internal clock signal based on a predetermined command combination or by dividing the external clock; however, exemplary embodiments of the present invention may also be applicable to methods of generating the internal clock signal in response to the external clock as long as a condition is satisfied prior to generating the internal clock signal.

In a test mode entry circuit and a test mode entry method according to an exemplary embodiment of the present invention, the sampling of unnecessary address combination signals may be reduced so that a timing margin required for safe entry of the test mode may be increased. Therefore, a semiconductor memory device operating at a high frequency may safely enter a test mode.

Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A method of entering a semiconductor memory device into a test mode, comprising:
generating an internal clock in response to an external clock when a first condition is satisfied;
generating an address combination signal based on a first address combination and the internal clock; and
entering the test mode using the internal clock and the address combination signal.

2. The method of claim 1, wherein the first condition is satisfied when a first command combination is generated.

3. The method of claim 2, wherein generating the internal clock includes:
activating the internal clock in response to the external clock when the first command combination is generated; or
deactivating the internal clock when the first command combination is not generated.

4. The method of claim 3, wherein the first command combination is not available in a user mode.

5. The method of claim 3, wherein entering the test mode is performed by generating a test mode entry signal by sampling the first address combination signal based on the internal clock that is delayed by a first time period.

6. The method of claim 1, wherein the first condition is that a first number of transitions of the external clock is reached.

7. The method of claim 6, wherein the internal clock is generated by dividing the external clock.

8. The method of claim 7, wherein entering the test mode is performed by using a signal generated by sampling the first address combination signal based on the internal clock delayed by a first time period.

9. A test mode entry circuit of a semiconductor memory device, comprising:
an internal clock generating unit configured to generate an internal clock signal in response to an external clock when a first condition is satisfied;
an address sampling unit configured to generate an address combination signal based on a first address combination and the internal clock signal; and
an entry control unit configured to perform a test mode entry based on the internal clock signal and the address combination signal.

10. The test mode entry circuit of claim 9, wherein the first condition is that a first command combination is generated.

11. The test mode entry circuit of claim 10, wherein the internal clock generating unit activates the internal clock signal in response to the external clock when the first command combination is generated or deactivates the internal clock when the first command combination is not generated.

12. The test mode entry circuit of claim 11, wherein the first command combination is not available in a user mode.

13. The test mode entry circuit of claim 11, wherein the internal clock generating unit includes:
a first inverter configured to receive the external clock;
at least one transistor serially coupled between the first inverter and a power supply voltage, wherein a gate electrode of the at least one transistor receives a buffered command signal; and
a second inverter configured to invert an output of the first inverter.

14. The test mode entry circuit of claim 11, wherein the entry control unit performs the test mode entry by generating a test mode entry signal by sampling the address combination signal based on the internal clock signal that is delayed by a first time period.

15. The test mode entry circuit of claim 14, wherein the test mode entry signal includes at least two test mode entry signals generated based on at least two address combinations.

16. The test mode entry circuit of claim 9, wherein the first condition is such that a first number of transitions of the external clock is reached.

17. The test mode entry circuit of claim 16, wherein the internal clock is generated by dividing the external clock with a first divide ratio.

18. The test mode entry circuit of claim 17, wherein the entry control unit performs the test mode entry by generating a test mode entry signal by sampling the address combination signal based on the internal clock signal that is delayed by a first time period.

19. A test mode entry circuit of a semiconductor memory device, comprising:
an internal clock generator that generates an internal clock signal according to a transition of a buffered clock in response to a first command combination;
a first address sampling unit that samples a buffered address based on the internal clock signal to activate a first address combination signal based on a first address combination;
a second address sampling unit that samples the buffered address based on the internal clock signal to activate a second address combination signal based on a second address combination; and a test mode entry controller that generates a first test mode entry signal based on the first address combination signal and a delayed internal clock signal and a second test mode entry signal based on the second address combination signal and the delayed internal clock signal.

20. The test mode entry circuit of claim 19, wherein the internal clock generator comprises:
   a command buffer that receives an external command signal, buffers the external command signal and outputs the buffered external command signal as the first command combination; and
   a clock generator that generates the internal clock signal according to the transition of the buffered clock in response to the first command combination.

21. The test mode entry circuit of claim 19, wherein the internal clock generator is a clock divider.

22. The test mode entry circuit of claim 19, wherein the test mode entry controller comprises:
   a first flip flop that samples the first address combination signal to generate the first test mode entry signal based on the delayed internal clock signal;
   a second flip flop that samples the second address combination signal to generate the second test mode entry signal based on the delayed internal clock signal; and
   a delay unit that generates the delayed internal clock signal based on the internal clock signal.

* * * * *